United States Patent
Lee et al.

(10) Patent No.: US 12,514,044 B2
(45) Date of Patent: Dec. 30, 2025

(54) DISPLAY DEVICE HAVING A REDUCED BEZEL

(71) Applicant: Samsung Display Co., LTD., Yongin-si (KR)

(72) Inventors: Seung-Kyu Lee, Hwaseong-si (KR); Su In Kim, Gunpo-si (KR); Byeong Jae Ahn, Anyang-si (KR); Gi Jung Lee, Anyang-si (KR); Su Jin Lee, Hwaseong-si (KR); Byeong Hoon Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 806 days.

(21) Appl. No.: 17/766,195

(22) PCT Filed: Oct. 6, 2020

(86) PCT No.: PCT/KR2020/013535
§ 371 (c)(1),
(2) Date: Apr. 1, 2022

(87) PCT Pub. No.: WO2021/071190
PCT Pub. Date: Apr. 15, 2021

(65) Prior Publication Data
US 2024/0063354 A1    Feb. 22, 2024

(30) Foreign Application Priority Data
Oct. 7, 2019 (KR) .......................... 10-2019-0123997

(51) Int. Cl.
*H10H 20/857* (2025.01)
*H01L 25/075* (2006.01)
*H01L 25/16* (2023.01)

(52) U.S. Cl.
CPC ....... *H10H 20/857* (2025.01); *H01L 25/0753* (2013.01); *H01L 25/167* (2013.01)

(58) Field of Classification Search
CPC ... H01L 33/62; H01L 25/0753; H01L 25/167; G02F 1/13452; G02F 1/1345;
(Continued)

(56) References Cited

U.S. PATENT DOCUMENTS

2017/0062379 A1\*  3/2017  Zhang .................... H01L 24/16
2017/0082900 A1   3/2017  Kong et al.
(Continued)

FOREIGN PATENT DOCUMENTS

KR    10-1998-0017596 A    6/1998
KR    10-2014-0118676 A    10/2014
(Continued)

OTHER PUBLICATIONS

English translation of "KR 20170005254 A" Park et al, "Display Device , Jan. 12, 2017" (Year: 2017).\*
International Search Report of PCT/KR2020/013535, Jan. 26, 2021, 4 pages.

*Primary Examiner* — Brian Turner
*Assistant Examiner* — Nicholas B Michaud
(74) *Attorney, Agent, or Firm* — Womble Bond Dickinson (US) LLP (57) ABSTRACT

The present disclosure relates to a display device, and one or more embodiments of the present disclosure provides a display device including: a first substrate provided with a main surface and a side surface that face different directions and are connected to each other; a wire disposed on the main surface of the first substrate and including a connection part; a connection conductive part including a side conductive part disposed on the side surface of the first substrate, and an inner conductive part that is connected to the side conductive part, is disposed on the main surface of the first (Continued)

substrate, and is electrically connected to the connection part; and a driving circuit part including a driving substrate disposed on the side conductive part, and a conductive protrusion that protrudes in a direction not parallel to a main surface of the driving substrate, wherein the protrusion is disposed on the main surface of the first substrate, disposed inside the inner conductive part, and is electrically connected to the inner conductive part.

19 Claims, 8 Drawing Sheets

(58) Field of Classification Search
CPC ....... G02F 1/13458; G09F 9/30; H05K 3/323; H05K 1/117; H05K 1/116; H05K 2201/10128; H05K 3/403
USPC .......................................................... 257/79
See application file for complete search history.

(56) References Cited

U.S. PATENT DOCUMENTS

| | | | |
|---|---|---|---|
| 2017/0358602 A1* | 12/2017 | Bae | H01L 23/482 |
| 2018/0197849 A1 | 7/2018 | Choi et al. | |
| 2019/0196632 A1* | 6/2019 | Ryu | G06F 3/0412 |
| 2019/0204652 A1 | 7/2019 | Lee et al. | |

FOREIGN PATENT DOCUMENTS

| | | | | |
|---|---|---|---|---|
| KR | 10-2017-0005254 A | 1/2017 | | |
| KR | 20170005254 A | * 1/2017 | ........... | G02F 1/1345 |
| KR | 10-2017-0034078 A | 3/2017 | | |
| KR | 10-2017-0034188 A | 3/2017 | | |
| KR | 10-2017-0139211 A | 12/2017 | | |
| KR | 10-2019-0053990 A | 5/2019 | | |
| KR | 10-2019-0083014 A | 7/2019 | | |

* cited by examiner

DISPLAY DEVICE HAVING A REDUCED BEZEL

CROSS-REFERENCE TO RELATED APPLICATIONS

This application is a U.S. National Phase Patent Application of International Patent Application Number PCT/KR2020/013535, filed on Oct. 6, 2020, which claims priority to Korean Patent Application Number 10-2019-0123997, filed on Oct. 7, 2019, the entire content of all of which is incorporated herein by reference.

TECHNICAL FIELD

The present disclosure relates to a display device.

BACKGROUND ART

Display devices such as a liquid crystal display (LCD), a light emitting diode display, and the like include a display panel on which a plurality of pixels capable of displaying an image are formed, and a driving circuit part capable of driving the display panel.

Each pixel may include a display part that may display an image, and a pixel circuit part that may transmit a data voltage to a pixel electrode disposed in the display part. The pixel circuit part includes at least one transistor electrically connected to the pixel electrode.

The driving circuit part may be connected to the display panel in a form of a flexible printed circuit film, a printed circuit board, or at least one driving circuit chip to transmit various driving signals to the display panel.

DESCRIPTION OF THE DISCLOSURE

Technical Aspect

The present disclosure has been made in an effort to provide a display device that may reduce a bezel of the display device and may increase stability and reliability for attachment of a driving circuit part to a display panel.

Technical Solution

One or more embodiments of the present disclosure provides a display device including: a first substrate provided with a main surface and a side surface that face different directions and are connected to each other; a wire disposed on the main surface of the first substrate and including a connection part; a connection conductive part including a side conductive part disposed on the side surface of the first substrate, and an inner conductive part that is connected to the side conductive part, is disposed on the main surface of the first substrate, and is electrically connected to the connection part; and a driving circuit part including a driving substrate disposed on the side conductive part, and a conductive protrusion that protrudes in a direction not parallel to a main surface of the driving substrate, wherein the protrusion is disposed on the main surface of the first substrate, disposed inside the inner conductive part, and is electrically connected to the inner conductive part.

The driving circuit part may further include a connection pad disposed on the driving substrate and electrically connected to the protrusion.

The connection pad may extend in a different direction from the protrusion; and the connection pad may be disposed on the side conductive part, and may be electrically connected to the side conductive part.

The connection part may include a first conductive part disposed on the main surface of the first substrate, and a second conductive part disposed above or below the first conductive part and electrically connected to the first conductive part.

The connection part may include a third conductive part disposed on the first conductive part and the second conductive part and electrically connected to the first conductive part and the second conductive part.

The third conductive part may be in contact with the inner conductive part.

The third conductive part may cover an edge of at least one of the first conductive part and the second conductive part.

The display device may further include a partition wall disposed on the wire, wherein the partition wall may include a horizontal part spaced apart from an edge of the first substrate on which the side surface of the first substrate is disposed, and a vertical part connected to the horizontal part and extending from the horizontal part to the edge of the first substrate.

The partition wall may surround an area on at least a portion of the connection part of the wire.

Two adjacent inner conductive parts may be insulated from each other by the partition wall.

The partition wall may include a first spacer disposed on the main surface of the first substrate.

The display device may further include a second substrate facing the first substrate, wherein the partition wall may further include a second spacer disposed below a main surface of the second substrate, and the first spacer and the second spacer may overlap each other in a direction perpendicular to the main surface of the first substrate.

The connection conductive part may include silver (Ag).

One or more other embodiments provide a display device including: a first substrate and a second substrate; a driving circuit part including a driving substrate that is disposed on side surfaces of edges of the first substrate and the second substrate; and a connection conductive part that is adjacent to the edges of the first substrate and the second substrate and includes an inner conductive part disposed between the first substrate and the second substrate, wherein the driving circuit part may be disposed in the inner conductive part, and includes a conductive protrusion electrically connected to the inner conductive part.

The connection conductive part may further include a side conductive part disposed between side surfaces of the first substrate and the second substrate and the driving substrate, and the side conductive part and the inner conductive part may be integrally connected.

The driving circuit part may further include a connection pad disposed on the driving substrate and electrically connected to the protrusion and the side conductive part.

The display device may further include a wire disposed on the first substrate and including a connection part disposed at an end portion thereof, wherein the connection part may include a first conductive part disposed on the first substrate, and a second conductive part covering an edge of the first conductive part and electrically connected to the first conductive part.

The second conductive part may be in contact with the inner conductive part.

The display device may further include a partition wall disposed between the first substrate and the second substrate, wherein the partition wall may include a horizontal part spaced apart from the edges of the first substrate and the second substrate, and a vertical part connected to the horizontal part and extending from the horizontal part to the edges.

One or more other embodiments provide a display device including: a substrate; a wire disposed on the substrate and including a connection part; an insulating layer disposed on the wire; a partition wall disposed on the insulating layer; an inner conductive part disposed between an edge of the substrate and the partition wall, and a driving circuit part that includes a driving substrate disposed on a side surface of the substrate, and a conductive protrusion connected to the driving substrate and protruding from the driving substrate, wherein the protrusion is disposed on the substrate, is disposed within the inner conductive part, and is electrically connected to the inner conductive part.

Technical Effects

According to the embodiments of the present disclosure, it is possible to reduce a bezel of a display device and to increase stability and reliability for attachment of a driving circuit part to a display panel.

MODE FOR EMBODIMENTS OF THE DISCLOSURE

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

In order to clearly describe the present disclosure, parts or portions that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Throughout the present specification, a plan view means a view when observing a surface parallel to two directions (for example, a first direction DR1 and a second direction DR2) crossing each other, and a cross-sectional view means a view when observing a surface cut in a direction (for example, a third direction) perpendicular to the surface parallel to the first direction DR1 and the second direction DR2. In addition, to overlap two elements means that two elements are overlapped in the third direction DR3 (for example, a direction perpendicular to an upper surface of the substrate) unless stated otherwise.

Hereinafter, a display device according to one or more embodiments of the present disclosure will be described with reference to FIG. 1.

Figure 1:
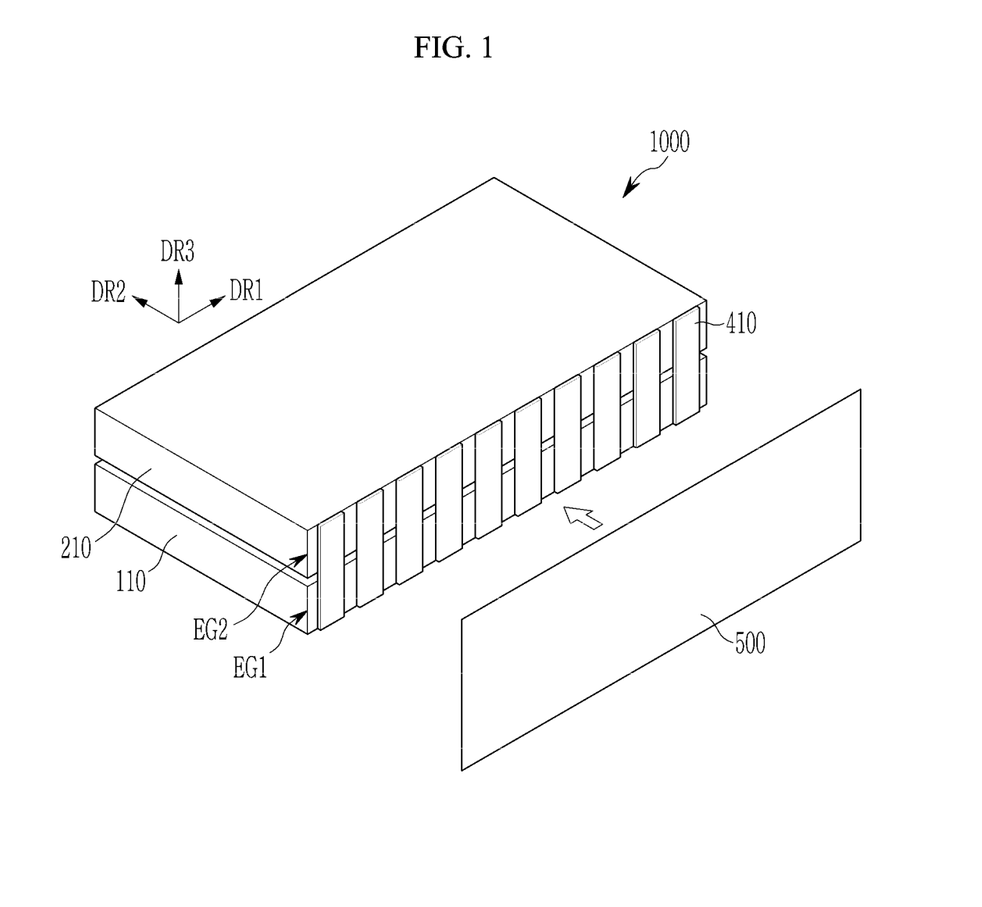
FIG. 1 illustrates a perspective view of a display device according to one or more embodiments of the present disclosure.

FIG. 1 illustrates a perspective view of a display device according to one or more embodiments of the present disclosure.

A display device according to one or more embodiments includes a display panel 1000 that includes a first substrate 110 and a second substrate 210 facing each other.

Main surfaces of the first substrate 110 and the second substrate 210 are disposed to be parallel to each other. In FIG. 1, the main surfaces of the first and second substrates 110 and 210 are shown to extend in parallel to first and second directions DR1 and DR2.

Each of the first substrate 110 and the second substrate 210 may have a fixed shape, or may be flexible. The first substrate 110 and the second substrate 210 may include glass, plastic, or the like. When the first substrate 110 and the second substrate 210 are flexible, they may include various plastics such as polyethylene terephthalate (PET), polyethylene naphthalate (PEN), polycarbonate (PC), polyarylate (PAR), polyetherimide (PEI), polyether sulfone (PES), or polyimide (PI), a metal thin film, an ultra-thin glass, or the like.

One edge EG1 of the first substrate 110 and one edge EG2 of the second substrate 210 may extend in parallel to each other. The edge EG1 of the first substrate 110 and the edge EG2 of the second substrate 210 may substantially extend in parallel in the first direction DR1.

A side surface of the edge EG1 of the first substrate 110 and a side surface of edge EG2 of the second substrate 210 may form a plane parallel to the first direction DR1. Here, the side surface of the edge EG1 means a side surface that is connected to the main surface of the first substrate 110 and is positioned at the edge EG1, and it is shown to be a plane parallel in the first direction DR1 and the third direction DR3 in FIG. 1. In addition, the side surface of the edge EG2 means a side surface that is connected to the main surface of the second substrate 210 and is positioned at the edge EG2, and it is shown to be a plane parallel in the first direction DR1 and the third direction DR3 in FIG. 1.

FIG. 1 shows an example in which the side surface of the edge EG1 of the first substrate 110 and the side surface of the edge EG2 of the second substrate 210 extend in the same direction and are positioned on the same plane, but the present disclosure is not limited thereto.

At least one of the side surface of the edge EG1 of the first substrate 110 and the side surface of the edge EG2 of the second substrate 210 may be perpendicular to the main surfaces of the first substrate 110 and the second substrate 210, but is not limited thereto. That is, at least one of the side surface of the edge EG1 of the first substrate 110 and the side surface of the edge EG2 of the second substrate 210 may form an inclined surface that is not perpendicular to the main surfaces of the first substrate 110 and the second substrate 210.

Hereafter, the edge EG1 of the first substrate 110 and the edge EG2 of the second substrate 210 are referred to as edges EG1 and EG2 of the display panel 1000, and the side surface of the edge EG1 of the first substrate 110 and the side surface of the edge EG2 of the second substrate 210 are referred to as side surfaces of the edges EG1 and EG2 of the display panel 1000.

A plurality of side conductive parts 410 may be disposed on at least a portion of the side surfaces of the edges EG1 and EG2 of the display panel 1000. The plurality of side conductive parts 410 may be formed on both the side surface of the edge EG1 of the first substrate 110 and the side surface of the edge EG2 of the second substrate 210, and may be formed only on the side surface of the edge EG1 or EG2 of one substrate 110 or 210.

The plurality of side conductive parts 410 may be arranged to be spaced apart from each other in one direction on the side surfaces of the edges EG1 and EG2 of the display panel 1000. For example, the plurality of side conductive parts 410 may be arranged to be spaced apart from each other along the first direction DR1.

Each side conductive part 410 may substantially extend long in the third direction DR3, and may extend across a space or a boundary between the first substrate 110 and the second substrate 210.

The display device according to one or more embodiments may include a driving circuit part 500 positioned on the plurality of side conductive parts 410 and electrically connected to the plurality of side conductive parts 410. The driving circuit part 500 may have a form of a flexible printed circuit film, a printed circuit board, or at least one driving circuit chip, and may be connected to the display panel 1000 to transmit various driving signals to the display panel 1000. FIG. 1 shows an example in which the driving circuit part 500 has a form of a flexible printed circuit film. The flexible printed circuit film may be provided with at least one driving circuit chip.

According to one or more other embodiments, one of the first substrate 110 and the second substrate 210 of the display panel 1000 may be omitted.

Hereinafter, the display device according to one or more embodiments of the present disclosure will be described with reference to FIG. 2 to FIG. 5 together with FIG. 1 described above.

Figure 2:
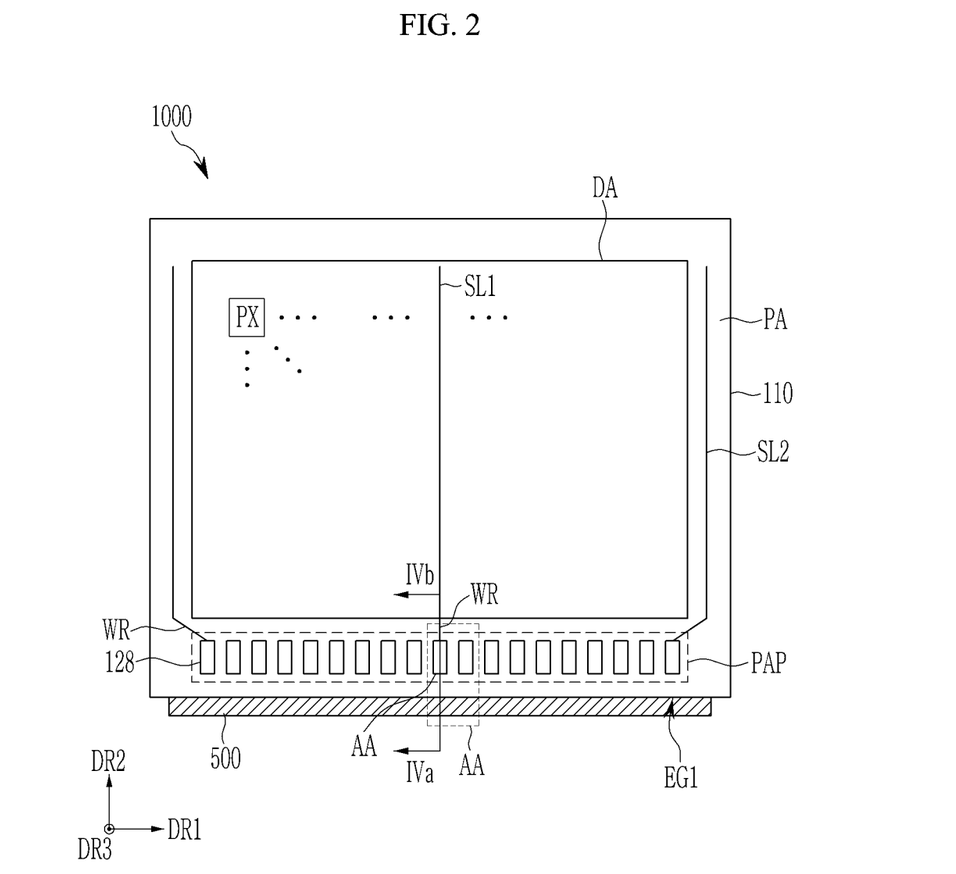
FIG. 2 illustrates a plane layout view of a display device according to one or more embodiments of the present disclosure.
Figure 3:
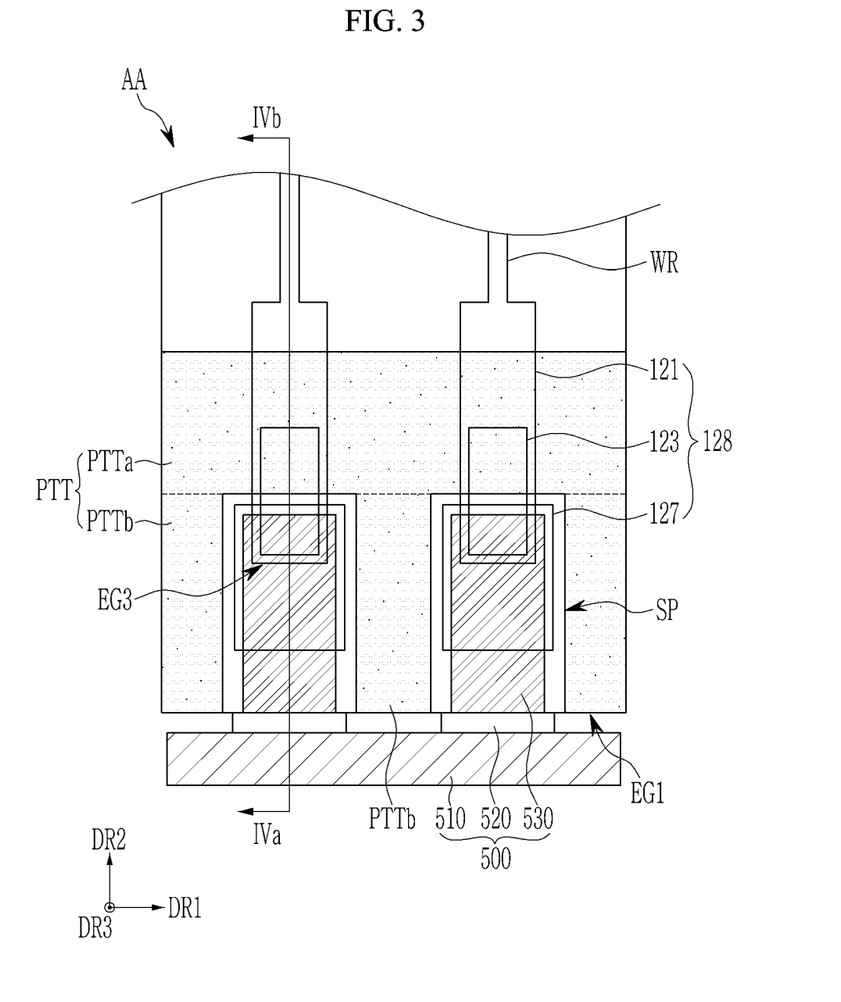
FIG. 3 illustrates an enlarged top plan view of a portion AA of the display device illustrated in FIG. 2.
Figure 4:
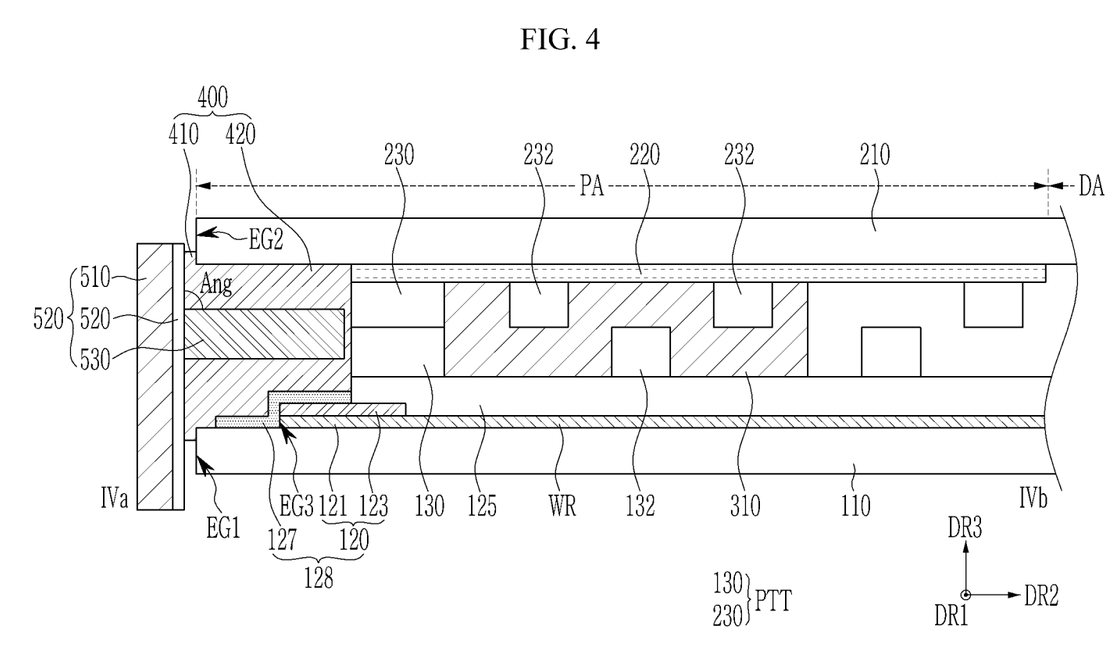
FIG. 4 illustrates a cross-sectional view taken along line IVa-IVb of the display device illustrated in FIG. 2 and FIG. 3.
Figure 5:
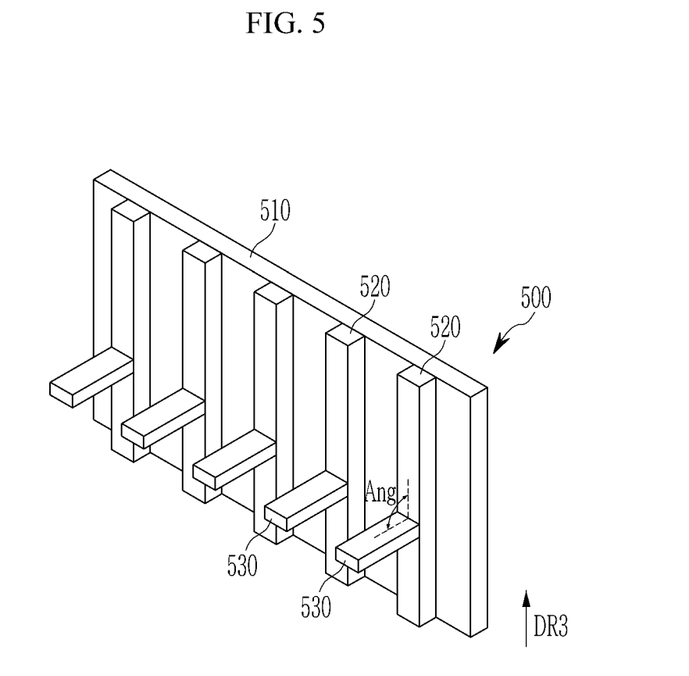
FIG. 5 illustrates a perspective view of a driving circuit part of a display device according to one or more embodiments of the present disclosure.

FIG. 2 illustrates a plane layout view of a display device according to one or more embodiments of the present disclosure, FIG. 3 illustrates an enlarged top plan view of a portion AA of the display device illustrated in FIG. 2, FIG. 4 illustrates a cross-sectional view taken along line IVa-IVb of the display device illustrated in FIG. 2 and FIG. 3, and FIG. 5 illustrates a perspective view of a driving circuit part of a display device according to one or more embodiments of the present disclosure.

Referring to FIG. 2, the display panel 1000 of the display device according to one or more embodiments of the present disclosure includes the first substrate 110, and the display panel 1000 and the main surface of the first substrate 110 may include a display area DA and a peripheral area PA disposed around the display area DA.

The display area DA is an area capable of displaying an image according to an input image signal, and includes a plurality of pixels PX and a plurality of signal lines SL1.

The pixel PX is a basic unit for displaying an image, and each pixel PX may include a pixel circuit part including at least one transistor and a display part for emitting light of an image. At least one pixel electrode may be disposed in the display part. The pixel electrode may be electrically connected to at least one transistor of the pixel circuit part. The display part may include, for example, a display element such as a light emitting diode including a pixel electrode, a common electrode, and an emission layer disposed between the pixel electrode and the common electrode.

The plurality of pixels PX may be regularly arranged, for example, in a matrix form.

The signal line SL1 may include a data line that transmits a data voltage corresponding to an input image signal to the pixel circuit part of the pixel PX. The plurality of signal lines SL1 may be substantially arranged in a direction parallel to the first direction DR1, and each signal line SL1 may substantially extend long in the second direction DR2. The data voltage may be applied to the pixel electrode as a pixel voltage through the pixel circuit part, and accordingly, the display part of each pixel PX may display an image of luminance corresponding to the data voltage.

The peripheral area PA may be an area that does not mostly display an image, and may be an area adjacent to the display area DA. The peripheral area PA may surround the display area DA.

Various voltage lines, driving signal lines, circuits, etc. may be disposed in the peripheral area PA. FIG. 2 illustrates a voltage line SL2 disposed in the peripheral area PA as a representative example. The voltage line SL2 may include a portion extending along a periphery of the display area DA.

The peripheral area PA may include a connection area PAP disposed between the edge EG1 of the first substrate 110 of the display panel 1000 and the display area DA.

A connection part 128, in order that various driving signal lines, voltage lines, signal lines, and the like disposed in the peripheral area PA and the display area DA receive a signal or voltage from the driving circuit part 500, may be disposed in the connection area PAP.

The signal line SL1 disposed in the display area DA may include a connection wire WR disposed in the peripheral area PA, and the connection wire WR of the signal line SL1 may include the connection part 128 disposed at an end portion thereof. The voltage line SL2 disposed in the peripheral area PA may also include the connection wire WR disposed toward the connection area PAP, and the connection wire WR of the voltage line SL2 may include the connection part 128.

A plurality of connection parts 128 may be substantially arranged in the first direction DR1 in the connection area PAP.

Referring to FIG. 3 and FIG. 4, the connection wire WR may be disposed on (e.g., above) the first substrate 110. The connection part 128 of the connection wire WR is disposed at an end portion of the connection wire WR adjacent to the edge EG1 of the first substrate 110, and may include at least one conductive part 121, 123, or 127. At least one conductive part 121, 123, or 127 included in the connection part 128 may be disposed in different conductive layers on the first substrate 110.

For example, the connection part 128 may include the first conductive part 121 disposed on the first substrate 110, the second conductive part 123 disposed above or below the first conductive part 121 and electrically connected to the first conductive part 121, and the third conductive part 127 disposed on the first conductive part 121 and the second conductive part 123 and electrically connected to the first conductive part 121 and the second conductive part 123.

The first conductive part 121 may be disposed on the same conductive layer as the connection wire WR other than the connection part 128. Referring to FIG. 3, in a plan view, the first conductive part 121 may have a wider width in the first direction DR1 than other parts of the connection wire WR.

Referring to FIG. 3 and FIG. 4, the second conductive part 123 may at least partially overlap the end portion of the first conductive part 121. FIG. 3 shows an example in which the second conductive part 123 is disposed within the edge(s) of the first conductive part 121 in a plan view, but the present disclosure is not limited thereto, and at least a portion of the second conductive part 123 may be disposed outside the first conductive part 121 to include a portion overlapping the edge of the first conductive part 121.

FIG. 4 shows an example in which the second conductive part 123 is disposed on the first conductive part 121, but alternatively, the second conductive part 123 may be disposed on a layer between the first conductive part 121 and the first substrate 110.

An end portion 120 of the connection wire WR may include the first conductive part 121, and may further include the second conductive part 123.

The third conductive part 127 may cover and overlap an edge of the end portion 120 of the connection wire WR. For example, the third conductive part 127 may cover and overlap at least a lower edge EG3 substantially extending in the first direction DR1 among the edge of the end portion 120 of the connection wire WR. That is, the third conductive part 127 may cover and overlap the lower edge EG3 of at least one of the first conductive part 121 and the second conductive part 123. The lower edges EG3 of the first conductive part 121 and the second conductive part 123 may be spaced apart from the edge EG1 of the first substrate 110.

Referring to FIG. 4, in a plan view, the third conductive part 127 may form a step-like shape of at least two layers.

At least one of the first conductive part 121 and the second conductive part 123 may include at least one of copper (Cu), aluminum (Al), magnesium (Mg), silver (Ag), gold (Au), platinum (Pt), palladium (Pd), nickel (Ni), neodymium Nd, iridium (Ir), molybdenum (Mo), tungsten (W), titanium (Ti), chromium (Cr), tantalum (Ta), and an alloy thereof, but is not limited thereto.

The third conductive part 127 may include a transparent conductive material such as an indium tin oxide (ITO), an indium zinc oxide (IZO), or a metal thin film, but is not limited thereto.

An insulating layer 125 may be disposed on the second conductive part 123. The insulating layer 125 may include an insulating material such as a silicon nitride (SiNx), a silicon oxide (SiOx), and a silicon oxynitride, and/or an organic insulating material.

The second conductive part 123 may include a portion overlapping the insulating layer 125 and a portion not overlapping the insulating layer 125 in the third direction DR3. That is, the second conductive part 123 may overlap a side surface of the insulating layer 125 in the third direction DR3.

The third conductive part 127 may not overlap the insulating layer 125, but alternatively, it may include a portion disposed on the insulating layer 125.

According to one or more other embodiments, the connection part 128 may not include at least one of the second conductive part 123 and the third conductive part 127. That is, at least one of the second conductive part 123 and the third conductive part 127 may be omitted.

At least one spacer 130 may be disposed on the insulating layer 125.

The spacer 130 may include at least one of an organic material such as a photoresist, a polyacrylate resin, a polyimide resin, and an acryl-based resin, and an inorganic material such as a silicon oxide and a silicon nitride.

The spacer 130 may be disposed on the connection part 128.

Referring to FIG. 3, the spacer 130 may be exposed without overlapping at least a portion of the connection part 128. For example, the spacer 130 may be exposed without overlapping at least a portion of the third conductive part 127.

The spacer 130 may also include a portion overlapping the connection part 128.

At least one dam 132 may be disposed on the insulating layer 125. The dam 132 may be disposed between the spacer 130 and the display area DA. The dam 132 may include the same material as at least some of the material included in the spacer 130.

When the display panel 1000 also includes the second substrate 210, a light blocking member 220 may be disposed under the second substrate 210 facing the first substrate 110. The light blocking member 220 may include a portion disposed in the peripheral area PA.

At least one spacer 230 may be disposed under the light blocking member 220. The spacer 230 may overlap the spacer 130.

In a plan view and a cross-sectional view, a shape of the spacer 230 may be the same as or similar to that of the spacer 130, but is not limited thereto. The spacer 130 and the spacer 230 may overlap each other in a vertical direction on an upper surface of the first substrate 110, so that they may serve to maintain a gap between the first substrate 110 and the second substrate 210.

The spacer 230 may include the same material as the spacer 130.

The spacer 130 and the spacer 230 overlapping each other in the third direction DR3 may form a partition wall PTT together.

Referring to FIG. 3, the partition wall PTT may include a horizontal part PTTa spaced apart from the edge EG1 of the first substrate 110 and extending in an extending direction of the edge EG1, that is, in parallel to the first direction DR1, and a vertical part PTTb connected to the horizontal part PTTa and extending from the horizontal part PTTa to the edge EG1 of the first substrate 110.

The horizontal part PTTa may not overlap at least a portion of the connection part 128. The horizontal part PTTa may be exposed without overlapping at least a portion of the third conductive part 127. The horizontal part PTTa may further include a portion overlapping the connection part 128.

The vertical part PTTb may be disposed between two adjacent connection parts 128 in the first direction DR1. The vertical part PTTb may substantially extend in the second direction DR2.

With respect to the connection part 128 of one connection wire WR, the horizontal part PTTa and two adjacent vertical parts PTTb connected to each other may form one space SP. Here, the space SP means an area that is disposed on at least a portion of the connection part 128 of the connection wire WR and is surrounded (e.g., partially surrounded) by the partition wall PTT. Two adjacent spaces SP are spaced apart and separated from each other.

At least one dam 232 may be disposed under the light blocking member 220. The dam 232 may be disposed between the spacer 230 and the display area DA. The dam 232 may include the same material as at least some of the material included in the spacer 230.

A sealant 310 may be disposed between the first substrate 110 and the second substrate 210. The sealant 310 may bond the first substrate 110 and the second substrate 210 to each other, and may seal the inside of the display panel 1000. In a plan view, the sealant 310 may be disposed in the peripheral area PA, and may have a closed curved line shape surrounding the display area DA.

Referring to FIG. 4, the sealant 310 may overlap at least one dam 132 or 232 in the third direction DR3. The sealant 310 may be disposed on the inside toward the display area DA with respect to the partition wall PTT. The sealant 310 may be in contact with the partition wall PTT, or may be spaced apart from the partition wall PTT.

A connection conductive part 400 may be disposed on an outer side toward the edge EG1 of the first substrate 110 or the edge EG2 of the second substrate 210 with respect to the partition wall PTT. The connection conductive part 400 may be disposed adjacent to the edge EG1 of the first substrate 110 and the edge EG2 of the second substrate 210.

The connection conductive part 400 may include the side conductive part 410 disposed on at least a portion of the side surfaces of the edges EG1 and EG2 of the first substrate 110 and the second substrate 210 as described above, and an inner conductive part 420 disposed on the first substrate 110 and positioned over the connection part 128.

The side conductive part 410 and the inner conductive part 420 are physically and electrically connected to each other, and may form one body or may be integrally formed.

Each inner conductive part 420 may be disposed to correspond to the connection part 128 of each connection wire WR, and may be electrically connected to each connection part 128. The inner conductive part 420 may be in contact with the third conductive part 127 of the connection part 128, and may include a portion contacting the first conductive part 121 and/or the second conductive part 123. When the third conductive part 127 is omitted, the inner conductive part 420 may contact the first conductive part 121 and/or the second conductive part 123.

Each inner conductive part 420 may be disposed in the space SP corresponding to each connection part 128. The inner conductive part 420 may occupy at least some of the space SP, and may substantially fill the entire space SP as shown in FIG. 4.

The inner conductive parts 420 of the adjacent connection conductive parts 400 may be insulated from each other by the partition wall PTT.

The connection conductive part 400 may include a metal such as silver (Ag).

Referring to FIG. 4 and FIG. 5, the driving circuit part 500 may include a driving substrate 510 on which a plurality of wires and an electronic circuit are formed, a plurality of connection pads 520, and a plurality of conductive protrusions 530.

Each of the plurality of connection pads 520 may be disposed to correspond to each of the plurality of connection conductive parts 400 of the display panel 1000. Each connection pad 520 may substantially extend in a direction parallel to the third direction DR3. The connection pad 520 may be conductive.

Each connection pad 520 may be connected on the side conductive part 410 of the corresponding connection conductive part 400 to contact the side conductive part 410, and may be electrically connected to the side conductive part 410 with at least one conductive connection part such as an anisotropic conductive film (ACF) interposed therebetween. The connection pad 520 may substantially extend parallel to the corresponding side conductive part 410 (for example, in the third direction DR3).

Each protrusion 530 is connected to each corresponding connection pad 520, and may have a protruding shape in a direction that is not parallel to a main surface of the driving substrate 510, for example, in a direction perpendicular to the main surface of the driving substrate 510. Each protrusion 530 may be electrically connected to each corresponding connection pad 520. An angle Ang between the protrusion 530 and the connection pad 520 connected to each other may be, for example, substantially a right angle, but is not limited thereto, and may be an angle that is about 60 degrees or more and 90 degrees or less.

According to one or more other embodiments, the side conductive part 410 of the connection conductive part 400 may be omitted.

Each protrusion 530 may include a portion disposed inside the inner conductive part 420 of the corresponding connection conductive part 400. That is, each protrusion 530 may be disposed on the main surface of the first substrate 110, and may be inserted into the space SP in which each inner conductive part 420 is disposed to be electrically connected to the inner conductive part 420. The protrusion 530 may directly contact the inner conductive part 420. The protrusion 530 may not contact the connection part 128 on the first substrate 110.

A position at which the protrusion 530 may enter the inside of the display panel 1000 may be limited by the partition wall PTT. That is, the protrusion 530 may be inserted only up to the side surface of the partition wall PTT. Accordingly, the protrusion 530 may be in contact with the side surface of the partition wall PTT, or may be spaced apart from the side surface of the partition wall PTT.

According to one or more embodiments, the driving circuit part such as a flexible printed circuit film, a printed circuit board, or at least one driving circuit chip is not attached in the third direction DR3 on the end portion of the connection wire WR on the main surface of the first substrate 110, but it is attached in the second direction DR2 thereon on the side surfaces of the edges EG1 and EG2 of the display panel 1000 (referred to as a side bonding structure), thus an area of the peripheral area PA for mounting the driving circuit part on the first substrate 110 may be reduced. Therefore, a bezel of the display device may be reduced.

A manufacturing process of the side bonding structure of attaching the driving circuit part 500 to the side surfaces of the edges EG1 and EG2 of the display panel 1000 may include a process of cutting a mother substrate in cell units to be divided into a plurality of display panels 1000 and then polishing the side surfaces of the edges EG1 and EG2 of the display panel 1000. In this case, the end portion of the connection wire WR connected to the driving circuit part 500 is also exposed to the polishing process, so that the end portion of the connection wire WR may be lifted from the first substrate 110. However, according to one or more embodiments, because the end portion 120 of the connection wire WR including the first conductive part 121 and the second conductive part 123 is spaced apart from the edge EG1 of the first substrate 110 (in a plan view), there is no risk that the end portion 120 of the connection wire WR is exposed to the polishing process. Accordingly, it is possible to prevent a defect in which the end portion 120 of the connection wire WR is lifted from the first substrate 110, and accordingly, an electrical connection defect between the driving circuit part 500 and the end portion 120 of the connection wire WR may be prevented. Accordingly, stability and reliability of attachment of the driving circuit part 500 to the display panel 1000 may be improved.

By the third conductive part 127 that is disposed on the end portion 120 of the connection wire WR and that covers and overlaps the edge EG3 of the end portion 120 of the connection wire WR, it is possible to further prevent a defect in which the end portion 120 of the connection wire WR is lifted from the first substrate 110. In addition, because the contact area between the third conductive part 127 and the connection conductive part 400 may be increased, contact stability and reliability between the connection part 128 of the connection wire WR and the connection conductive part 400 may be further improved.

According to one or more embodiments, through the protrusion 530 that is inserted into the space SP on the first substrate 110, the driving circuit part 500 may be electrically connected to the connection conductive part 400 and the end portion 120 of the connection wire WR not only on the side surface of the display panel 1000 but also inside the display panel 1000. Accordingly, the connection area between the driving circuit part 500 and the end portion 120 of the connection wire WR is increased, thereby further improving the stability and reliability of attachment of the driving circuit part 500 to the display panel 1000.

Hereinafter, a display device according to one or more embodiments will be described with reference to FIG. 6 together with the drawings described above.

Figure 6:
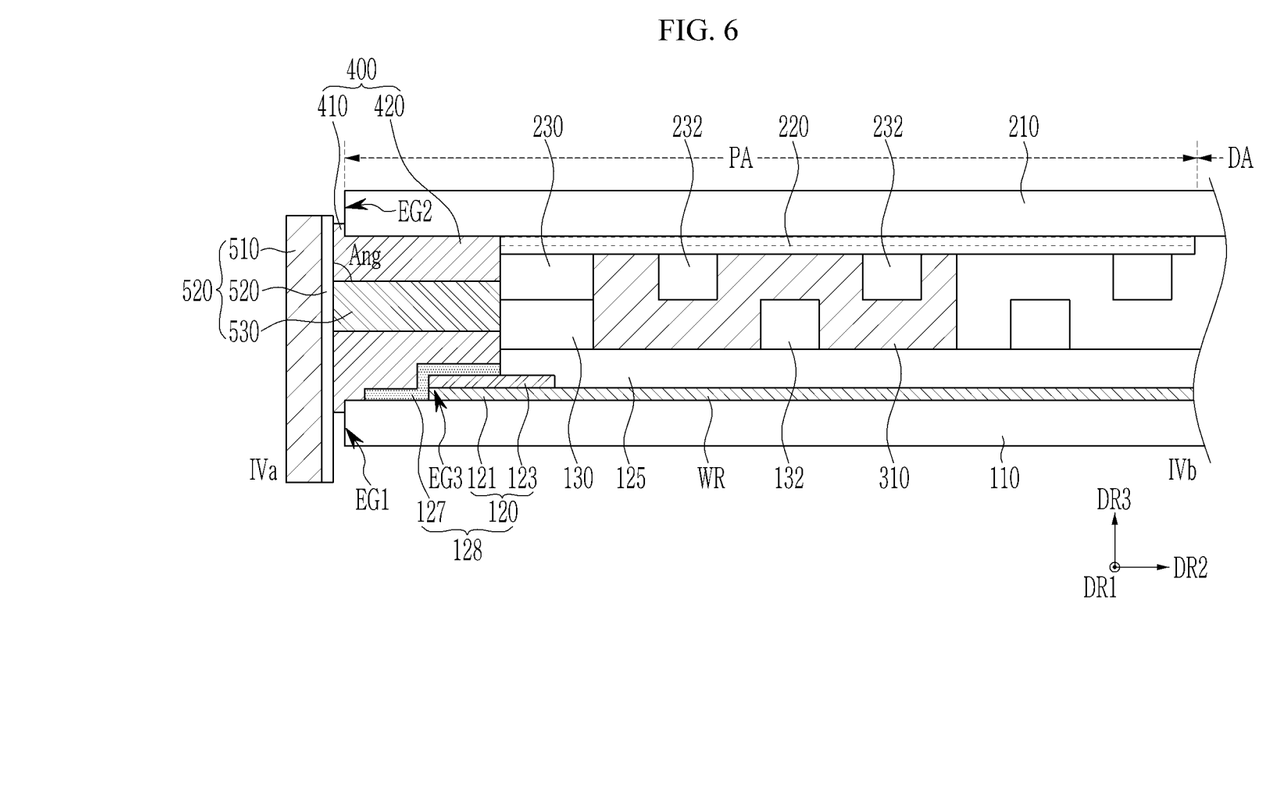
FIG. 6 illustrates another example of a cross-sectional view taken along line IVa-IVb of the display device illustrated in FIG. 2.

FIG. 6 illustrates another example of a cross-sectional view taken along line IVa-IVb of the display device illustrated in FIG. 2.

Referring to FIG. 6, the display device according to one or more embodiments is mostly the same as the one or more embodiments described above, but an end of the protrusion 530 of the driving circuit part 500 may contact the side surface of the partition wall PTT. Because the protrusion 530 is blocked by the partition wall PTT, the risk of the protrusion 530 being short-circuited with another conductive layer may be eliminated.

Hereinafter, a display device according to one or more embodiments will be described with reference to FIG. 7 together with the drawings described above.

Figure 7:
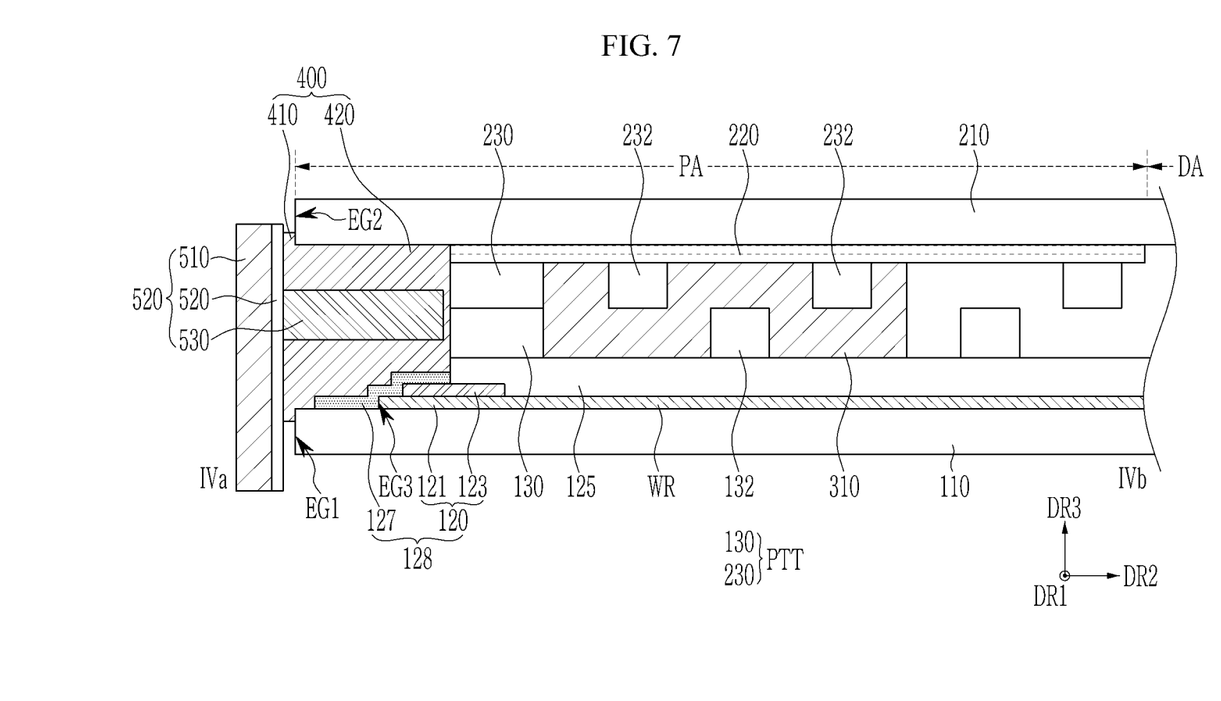
FIG. 7 illustrates another example of a cross-sectional view taken along line IVa-IVb of the display device illustrated in FIG. 2.

FIG. 7 illustrates another example of a cross-sectional view taken along line IVa-IVb of the display device illustrated in FIG. 2.

Referring to FIG. 7, the display device according to one or more embodiments is mostly the same as the one or more embodiments described above, but in the end portion 120 of the connection wire WR, the second conductive part 123 may not cover at least a portion of the end portion of the first conductive part 121. Accordingly, in a cross-sectional view, an edge portion of the end portion 120 of the connection wire WR may form a step-like shape.

The third conductive part 127 disposed on the end portion 120 of the connection wire WR may cover the edge of the first conductive part 121 and the edge of the second conductive part 123, and accordingly, in a cross-sectional view, the third conductive part 127 may form a step-like shape of at least three layers.

Therefore, according to one or more embodiments, because the contact area between the third conductive part 127 and the connection conductive part 400 may be further increased, the contact stability and reliability between the connection part 128 of the connection wire WR and the connection conductive part 400 may be further improved.

Hereinafter, a display device according to one or more embodiments will be described with reference to FIG. 8 together with the drawings described above.

Figure 8:
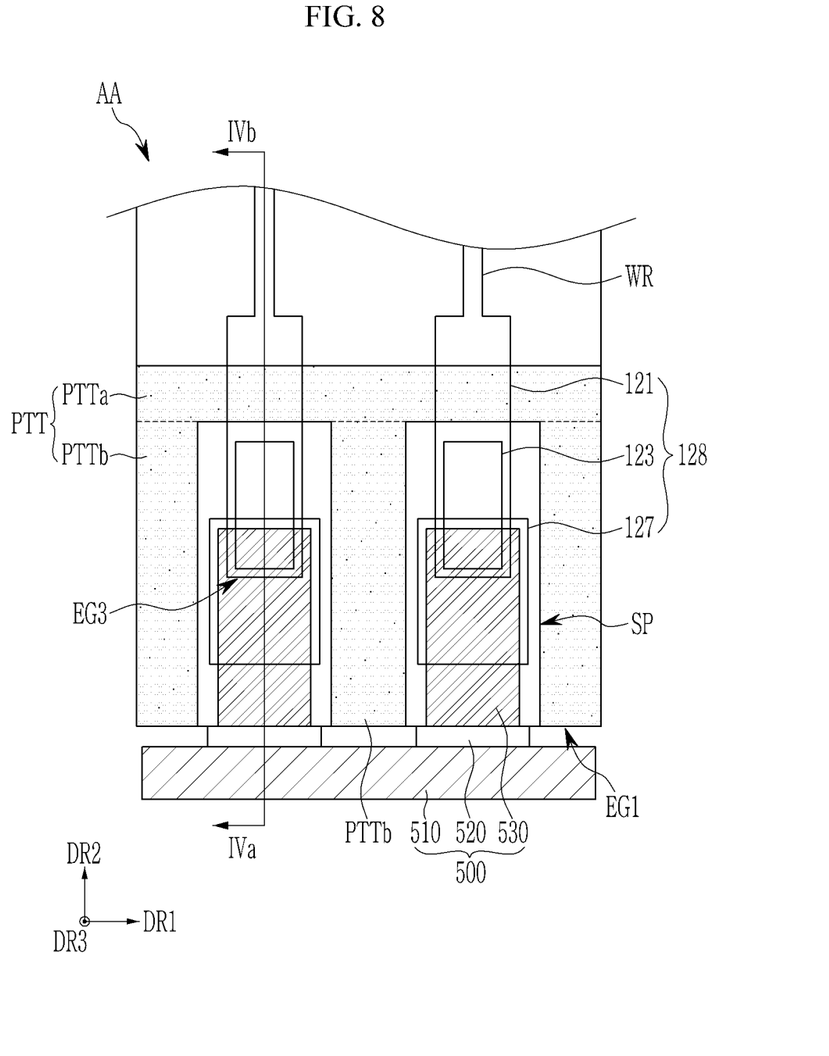
FIG. 8 illustrates another example of an enlarged top plan view of the portion AA of the display device illustrated in FIG. 2.

FIG. 8 illustrates another example of an enlarged top plan view of the portion AA of the display device illustrated in FIG. 2.

Referring to FIG. 8, the display device according to one or more embodiments is mostly the same as the one or more embodiments described above, but a width of the horizontal part PTTa of the partition wall PTT in the second direction DR2 may be narrower. For example, the horizontal part PTTa may not overlap the second conductive part 123. Accordingly, a length of the second direction DR2 of the space SP corresponding to the connection part 128 of each connection wire WR may be longer than that of the one or more embodiments illustrated in FIG. 3 described above. Accordingly, the contact area between the inner conductive part 420 of the connection conductive part 400 and the connection part 128 may be further increased.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

The invention claimed is:

1. A display device comprising:
a first substrate provided with a main surface and a side surface that face different directions and are connected to each other;
a wire disposed on the main surface of the first substrate and including a connection part;
a connection conductive part including:
a side conductive part disposed on the side surface of the first substrate; and
an inner conductive part that is connected to the side conductive part, wherein the inner conductive part is disposed on the main surface of the first substrate, and is electrically connected to the connection part; and
a driving circuit part including:
a driving substrate disposed on the side conductive part and having a main surface parallel to the side surface of the first substrate; and
a conductive protrusion that protrudes in a direction not parallel to the main surface of the driving substrate, wherein the conductive protrusion has a distal end having a surface facing away from the main surface of the driving substrate in the direction not parallel to the main surface of the driving substrate, is disposed on the main surface of the first substrate, and is disposed inside the inner conductive part such that the surface facing away from the main surface of the driving substrate contacts the inner conductive part to be electrically connected to the inner conductive part, wherein the side conductive part is disposed between the side surface of the first substrate and the driving substrate, and wherein the side conductive part and the inner conductive part are integrally connected.

2. The display device of claim 1, wherein the driving circuit part further includes a connection pad disposed on the driving substrate and electrically connected to the conductive protrusion.

3. The display device of claim 2, wherein:

the connection pad extends in a different direction from the conductive protrusion; and the connection pad is disposed on the side conductive part and is electrically connected to the side conductive part.

4. The display device of claim 1, wherein the connection part includes:

a first conductive part disposed on the main surface of the first substrate; and a second conductive part disposed above or below the first conductive part and electrically connected to the first conductive part.

5. The display device of claim 4, wherein the connection part further includes a third conductive part disposed on the first conductive part and the second conductive part and electrically connected to the first conductive part and the second conductive part.

6. The display device of claim 5, wherein the third conductive part is in contact with the inner conductive part.

7. The display device of claim 6, wherein the third conductive part covers an edge of at least one of the first conductive part and the second conductive part.

8. The display device of claim 1, further comprising a partition wall disposed on the wire, wherein the partition wall includes a horizontal part spaced apart from an edge of the first substrate on which the side surface of the first substrate is disposed, and a vertical part connected to the horizontal part and extending from the horizontal part to the edge of the first substrate.

9. The display device of claim 8, wherein the partition wall at least partially surrounds an area on at least a portion of the connection part of the wire.

10. The display device of claim 9, wherein two adjacent inner conductive parts are insulated from each other by the partition wall.

11. The display device of claim 10, wherein the partition wall includes a first spacer disposed on the main surface of the first substrate.

12. The display device of claim 11, further comprising a second substrate facing the first substrate, wherein the partition wall further includes a second spacer disposed below a main surface of the second substrate, and wherein the first spacer and the second spacer overlap each other in a direction perpendicular to the main surface of the first substrate.

13. The display device of claim 1, wherein the connection conductive part includes silver (Ag).

14. A display device comprising:

a first substrate and a second substrate;

a driving circuit part including a driving substrate that is disposed on side surfaces of edges of the first substrate and the second substrate, the driving substrate having a main surface parallel to the side surfaces of the first substrate and the second substrate; and a connection conductive part including an inner conductive part, the inner conductive part being adjacent to the edges of the first substrate and the second substrate, and disposed between the first substrate and the second substrate, wherein the driving circuit part includes a conductive protrusion, the conductive protrusion being disposed in the inner conductive part, and having a distal end having a surface facing away from the main surface of the driving substrate in a direction not parallel to the main surface of the driving substrate, the surface contacting the inner conductive part to be electrically connected to the inner conductive part, wherein the connection conductive part further includes a side conductive part disposed between side surfaces of the first and second substrates and the driving substrate, and wherein the side conductive part and the inner conductive part are integrally connected.

15. The display device of claim 14, wherein the driving circuit part further includes a connection pad disposed on the driving substrate and electrically connected to the conductive protrusion and the side conductive part.

16. The display device of claim 14, further comprising a wire disposed on the first substrate and including a connection part disposed at an end portion of the wire, wherein the connection part includes:

a first conductive part disposed on the first substrate; and a second conductive part covering an edge of the first conductive part and electrically connected to the first conductive part.

17. The display device of claim 16, wherein the second conductive part is in contact with the inner conductive part.

18. The display device of claim 14, further comprising a partition wall disposed between the first substrate and the second substrate, wherein the partition wall includes a horizontal part spaced apart from the edges of the first substrate and the second substrate, and a vertical part connected to the horizontal part and extending from the horizontal part to the edges.

19. A display device comprising:

a substrate;

a wire disposed on the substrate and including a connection part;

an insulating layer disposed on the wire;

a partition wall disposed on the insulating layer;

an inner conductive part disposed between an edge of the substrate and the partition wall; and a driving circuit part that includes:

a driving substrate disposed on a side surface of the substrate and having a main surface parallel to the side surface of the substrate;

a conductive protrusion connected to the driving substrate; and a side conductive part disposed between the side surface of the substrate and the driving substrate, wherein the conductive protrusion protrudes from the driving substrate, has a distal end having a surface facing away from the main surface of the driving substrate in a direction not parallel to the main surface of the driving substrate, is disposed on the substrate, and is disposed within the inner conductive part such that the surface facing away from the main surface of the driving substrate contacts the inner conductive part to be electrically connected to the inner conductive part, and wherein the side conductive part and the inner conductive part are integrally connected.

* * * * *